(12) United States Patent
Cheng et al.

(10) Patent No.: US 10,295,575 B2
(45) Date of Patent: May 21, 2019

(54) CURRENT SENSOR AND BATTERY CURRENT MONITORING SYSTEM

(71) Applicants: Win Sheng Cheng, Cupertino, CA (US); Jeff Yeu-Farn Hsieh, Los Altos, CA (US); YiChien Hwang, Fremont, CA (US)

(72) Inventors: Win Sheng Cheng, Cupertino, CA (US); Jeff Yeu-Farn Hsieh, Los Altos, CA (US); YiChien Hwang, Fremont, CA (US)

(73) Assignee: PALCELLs Technology, Inc., Milpitas, CA (US)

( * ) Notice: Subject to any disclaimer, the term of this patent is extended or adjusted under 35 U.S.C. 154(b) by 0 days.

(21) Appl. No.: 15/582,210

(22) Filed: Apr. 28, 2017

(65) Prior Publication Data

US 2017/0315156 A1    Nov. 2, 2017

Related U.S. Application Data

(60) Provisional application No. 62/329,904, filed on Apr. 29, 2016.

(51) Int. Cl.
| | | |
|---|---|---|
| *G01N 27/416* | (2006.01) | |
| *G01R 15/20* | (2006.01) | |
| *G01R 31/382* | (2019.01) | |

(52) U.S. Cl.
CPC ......... *G01R 15/202* (2013.01); *G01R 31/382* (2019.01)

(58) Field of Classification Search
CPC .. G01R 15/183; G01R 15/202; G01R 15/204; G01R 15/205; G01R 15/206; G01R 15/207; G01R 15/14; G01R 15/20; G01R 19/0092; G01R 13/02; G01R 21/08; G01R 11/32; G01R 33/18; G01R 33/02; H01L 41/12; H01L 41/16; H02K 41/06
See application file for complete search history.

(56) References Cited

U.S. PATENT DOCUMENTS

| | | | |
|---|---|---|---|
| 7,106,047 B2 | 9/2006 | Taniguchi | |
| 7,936,164 B2 | 5/2011 | Doogue et al. | |
| 2005/0038614 A1 | 2/2005 | Botts et al. | |
| 2010/0001715 A1* | 1/2010 | Doogue | G01R 15/207 324/117 H |
| 2010/0244868 A1 | 9/2010 | Cantave et al. | |
| 2012/0038360 A1* | 2/2012 | Lenglet | G01R 15/185 324/253 |
| 2012/0200291 A1* | 8/2012 | Carpenter | G01R 1/22 324/252 |
| 2013/0073235 A1 | 3/2013 | Reyntens et al. | |

(Continued)

OTHER PUBLICATIONS

The International Search Report and Written Opinion rendered by the International Searching Authority for PCT/US2017/030228, dated Sep. 12, 2017, 11 pages.

*Primary Examiner* — Thang X Le
(74) *Attorney, Agent, or Firm* — Skaar Ulbrich Macari, P.A.

(57) ABSTRACT

A current sensor includes a two-piece ferromagnetic core clamped together over a wire to be measured by a housing to form a ferromagnetic cylinder that concentrates the magnetic flux surrounding the electrical wire to be measured. By directing the magnetic flux to a Hall effect sensor, the current can be measured in the wire without cutting or modifying the wire.

18 Claims, 8 Drawing Sheets

(56) References Cited

U.S. PATENT DOCUMENTS

| | | | |
|---|---|---|---|
| 2014/0001730 A1* | 1/2014 | Kulkarni | B60Q 1/0088 |
| | | | 280/422 |
| 2014/0028303 A1 | 1/2014 | Ostrogorska et al. | |
| 2014/0167750 A1* | 6/2014 | Akieda | G01R 15/202 |
| | | | 324/251 |
| 2014/0176164 A1* | 6/2014 | Davis | A46B 9/028 |
| | | | 324/709 |
| 2015/0069998 A1* | 3/2015 | Nero, Jr. | G01R 15/142 |
| | | | 324/126 |
| 2016/0005534 A1* | 1/2016 | Koo | G01R 15/183 |
| | | | 455/41.1 |
| 2016/0011241 A1* | 1/2016 | Phillips | G01R 15/202 |
| | | | 324/251 |

* cited by examiner

CURRENT SENSOR AND BATTERY CURRENT MONITORING SYSTEM

PRIORITY

This application claims the priority benefit of U.S. Provisional Application No. 62/329,904 filed on Apr. 29, 2016, which is hereby incorporated herein by reference in its entirety.

FIELD

The present invention relates generally to electrical current sensors, and more particularly, to low cost and non-invasive electrical current sensors and current sensor monitor systems.

BACKGROUND

There are many reasons to monitor DC (direct electrical current). For example, smart energy usage systems can use current data to monitor and manage the electrical power usage of a given electrical system. However, most conventional DC current sensors require invasive connections in a circuit, or are expensive or require a complex installation. For example, one conventional solution requires detaching the electrical wire, feeding it through a hole in the current sensor's magnetic core and reattaching the wire back to the connector or connecting one end to the sensor input and the other end to the sensor output. Thus, there is a major limitation of conventional current sensors of having to disconnect a potentially dangerous high DC voltage and high DC current and then re-wiring in order to install a current sensor.

Therefore, there is a need to provide a direct current sensor with a simplified installation that does not require disconnecting or touching of the DC wires.

SUMMARY

The present invention addresses the above-noted drawbacks of conventional power storage and distribution systems by providing a device and method to measure the DC current of an electrical wire. The device clamps over the wire to be measured even where the wire is covered with insulation.

In one example embodiment, a two-piece ferromagnetic core is clamped together over the wire by a housing to form a ferromagnetic cylinder that concentrates the magnetic flux surrounding the electrical wire to be measured. By directing the magnetic flux to a Hall effect sensor, the DC or AC current can be measured. The core can also be formed in other non-cylindrical shapes that similarly concentrate flux into the Hall effect sensor area.

The disclosure includes a current sensor (such as a Hall effect sensor), comprising a housing, a core disposed within the housing, and a sensor that senses magnetic field. The core is formed of a magnetic material and defines a central channel through which a wire, whose current is to be measured, can be disposed without cutting or modifying the wire.

The housing can be configured as a two-part clamshell, wherein the core is divided into at least two segments, and wherein one of the at least two segments is disposed in a first part of the two-part clamshell and a second of the at least two segments is disposed in a second part of the two-part clamshell.

The two-part clamshell housing can be hinged along a first side and a latch is provided to a second opposing side thereof.

The two-part clamshell can define a plurality of teeth that protrude inwardly into at least one of the apertures at the first and second longitudinal opposing ends of the housing.

One part of the two-part clamshell can include a sensor aperture defined through a wall thereof. One of the at least two segments of the core can include a corresponding sensor aperture aligned with the sensor aperture in the clamshell.

One part of the two-part clamshell can include a sensor notch defined in a wall thereof, and wherein the sensor is disposed in a gap formed between opposing lengthwise edge surfaces of adjacent segments of the core.

One or more of the core segments can define a notch inwardly from each longitudinal end thereof.

The core can resemble a hollow cylindrical tube. The core can also have a circular or non-circular cross-sectional shape.

The core can be shaped to concentrate magnetic flux into the Hall effect sensor.

The housing can be formed of a plastic insulator material.

The sensor can include a current monitor control board. The current monitor control board can include an analog to digital converter (ADC), signal conditioner and level shifter, and a microcontroller. The Hall effect sensor can be coupled to a current monitor control board which includes the ADC and microcontroller. A wireless module can also be coupled to the microcontroller.

The disclosure further includes a method of non-invasively measuring electrical current in a wire. A magnetic core is clamped around the wire while leaving the wire intact. A magnetic flux surrounding the wire is concentrated by the core, and then directed to a Hall effect sensor. The magnetic flux is measured and a voltage corresponding to the measured magnetic flux is outputted.

The wire can be looped one or more times prior to clamping so that the wire passes through the core multiple times to increase the sensor sensitivity.

The output voltage from the Hall effect sensor can be coupled to an ADC and related circuitry, and the ADC can be coupled to a microcontroller. The microcontroller can be coupled to a wireless communications interface.

The magnetic core can be segmented into at least a first and second portion. Each of the first and second portions of the magnetic core can be housed in a respective first and second portion of an insulated enclosure.

The disclosure additionally includes a battery current monitoring system. The system includes a battery module, a charger coupled to the battery module, coupled to a load, coupled to the battery module, a switch disposed between the load and the battery module, wire or wires coupled to the battery module, and current sensor clamped around the wire such that the wire extends through the core while leaving the wire intact. The load can be, for example, a motor and related control board or a starter motor.

Wires coupled to the battery or batteries can provide the battery voltage to be measured and used to provide the power supply to the current monitor system. The current monitor system together with current sensor can be attached to any battery module and the data can be communicated wirelessly to any system. The battery module voltages and current can be processed continuously by an onboard microcontroller or remote end computer to be used to decide the health, capacity and status of the battery cells inside battery modules and the status of the charging system.

The current sensor for the monitoring system can be configured as disclosed in the various embodiments herein.

The above summary is not intended to limit the scope of the invention, or describe each embodiment, aspect, implementation, feature or advantage of the invention. The detailed technology and preferred embodiments for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

Figure 1:
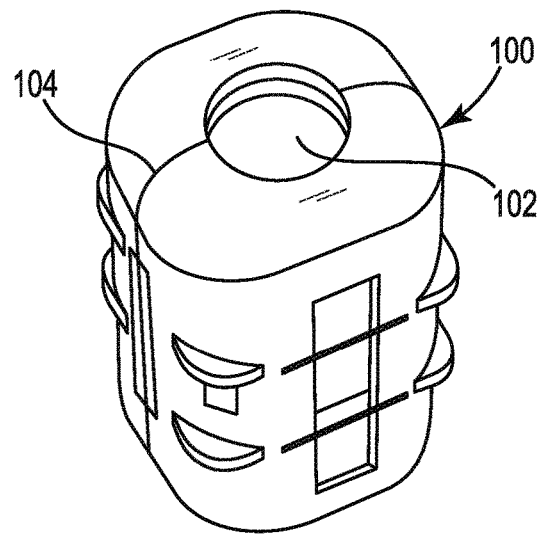
FIG. 1 is a perspective view of a current sensor according to certain embodiments.
Figure 2:
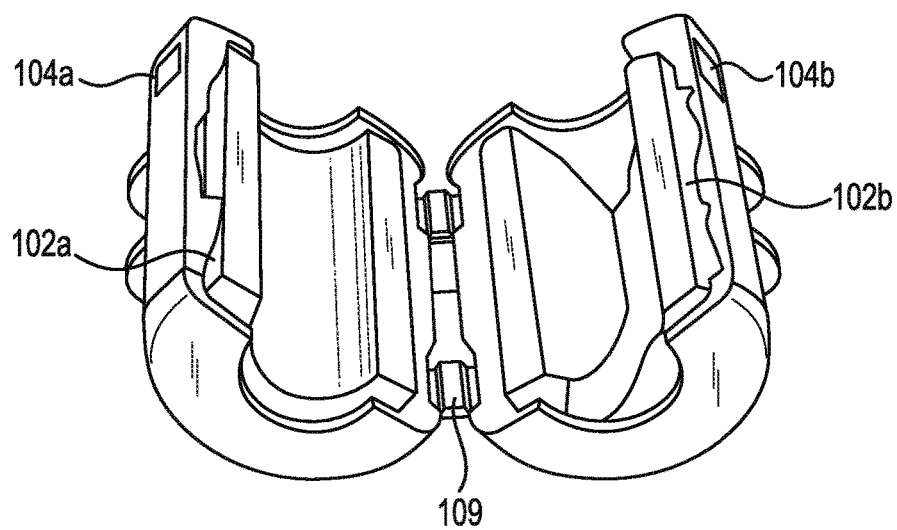
FIGS. 2-4 are perspective views of the current sensor of FIG. 1 showing the enclosure opened.

While the invention is amenable to various modifications and alternative forms, specifics thereof have been shown by way of example in the drawings and will be described in detail. It should be understood, however, that the intention is not to limit the invention to the particular example embodiments described. On the contrary, the invention is to cover all modifications, equivalents, and alternatives falling within the scope of the invention as defined by the appended claims.

DETAILED DESCRIPTION

In the following descriptions, the present invention will be explained with reference to various exemplary embodiments. Nevertheless, these embodiments are not intended to limit the present invention to any specific example, environment, application, or particular implementation described herein. Therefore, descriptions of these example embodiments are only provided for purpose of illustration rather than to limit the present invention.

The invention is non-intrusive, non-invasive and easily attached to the measurement target to provide a convenient way to monitor the voltage/current/power of the target automatically. Thus, it does not require the conventional steps of disconnecting the wire from its fixture, inserting the wire into a ferromagnetic cylinder, and then reconnecting the wire back to the fixture. The associated current monitor control board can be built inside the current sensor housing module and attached to measurement wires. The power can be drawn from the measurement target. The invention is very convenient to install, easy to use and can be manufactured at a relatively low cost.

Referring to FIGS. 1-8, the current sensor 100 in a first embodiment comprises a core 102 disposed inside of a housing 104. The core is divided into two half-cylinder ferromagnetic core portions 102a and 102b. When clamped together these portions 102a and 102b form a hollow ferromagnetic cylinder that concentrates the magnetic flux surrounding the electrical wire being measured. And by directing the magnetic flux to a Hall effect sensor 106 disposed in the housing, the sensor 100 enables current flowing through the wire extending through the core to be measured non-invasively.

The core 102 can also be formed in other non-cylindrical shapes that concentrate flux into the Hall effect sensor area without departing from the scope of the invention. For example, the core can be square, rectangular and other polygonal shapes in cross-section.

The housing or enclosure 104 can be formed of a plastic insulative material. The housing can be split into two hinged halves 104a and 104b as shown and closed like a clamshell. A latch or multiple latches 108 can be provided opposite the hinged edge 109 to secure the enclosure halves together. The latch 108 can include a male tab 108a disposed on one edge of the first clamshell side and a female receptacle 108b for the male tab that is disposed on an opposing edge of the opposing clamshell side of the enclosure 104. Other latching mechanisms can also be provided in alternative embodiments.

The core 102 comprises two ferromagnetic components (portions) or halves 102a and 102b as noted above. The core components 102a and 102b can be affixed to the interior of the plastic enclosure 104 (e.g., via glue or other suitable means). The core 102 can also be divided into more than two separate portions which can be same or different shapes as well without departing from the scope of the invention.

Figure 5:
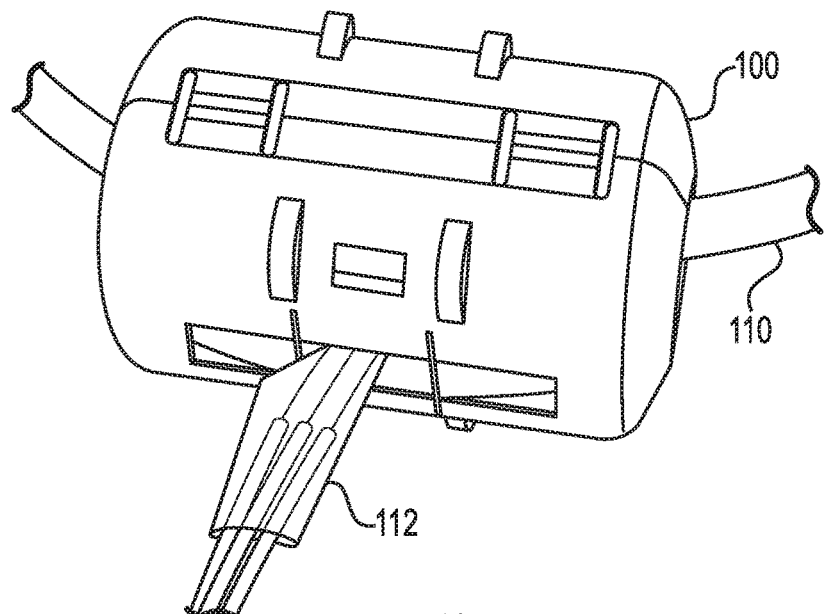
FIG. 5 is a perspective view of the current sensor of FIG. 1 with the Hall effect sensor attached to a wire according to certain embodiments.
Figure 6:
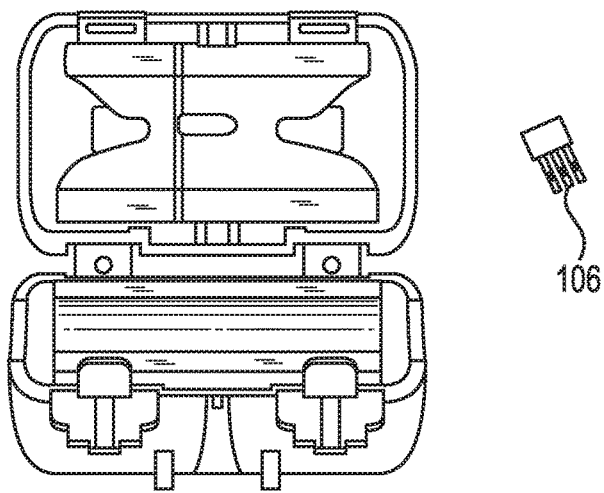
FIG. 6 is a perspective view of the current sensor of FIG. 1 showing the enclosure opened and the Hall effect sensor separated.

In use, the enclosure 104 is closed around the wire 110 being sensed as shown in FIG. 5. This results in the wire 110 extending through the center channel of the cylindrical core 102 without the need to cut, modify or otherwise compromise the wire. Wire leads 112 are also shown extending from the Hall effect sensor in FIG. 5.

Figure 3:
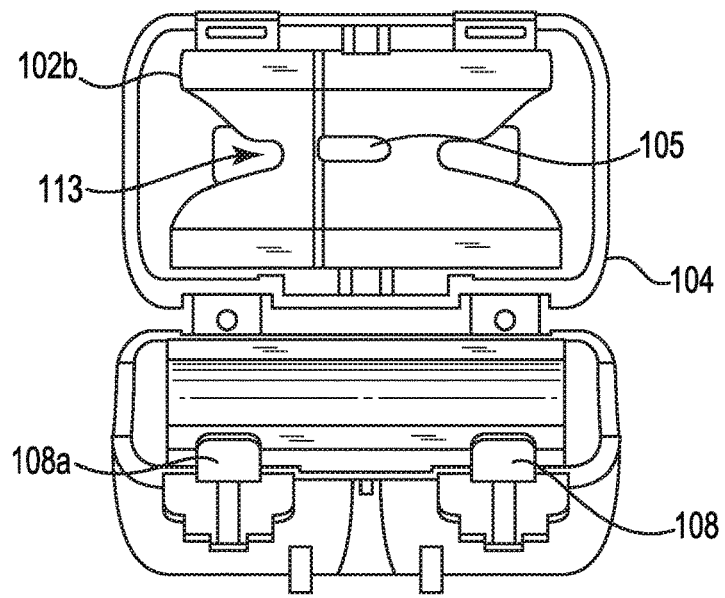
Figure 4:
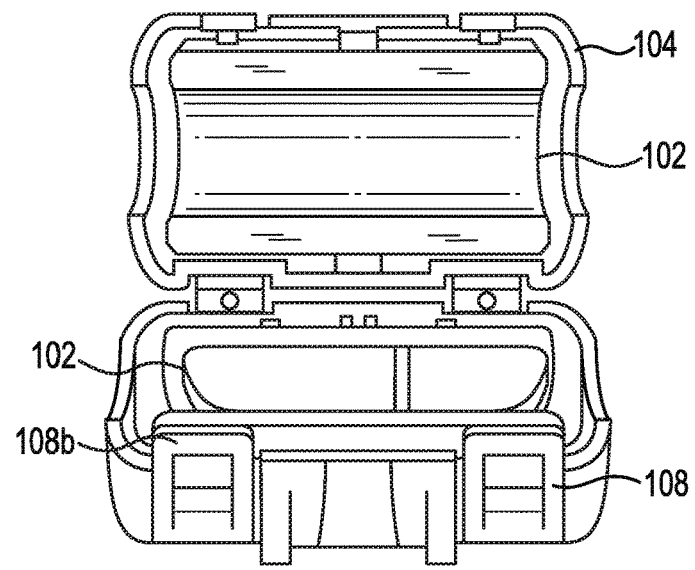
Figure 7:
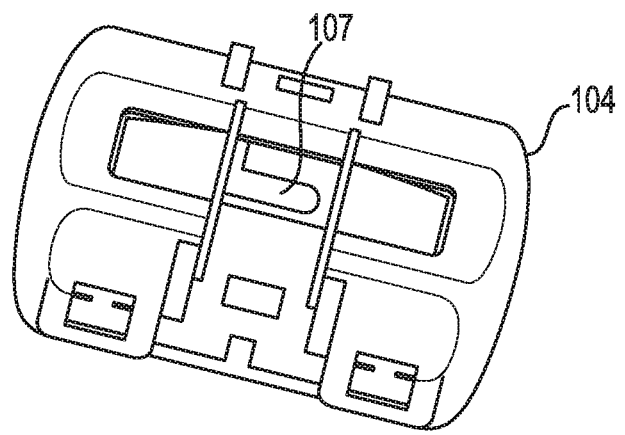
FIG. 7 is a perspective view of the current sensor of FIG. 1 showing the aperture where the Hall effect sensor is disposed according to certain embodiments.
Figure 8:
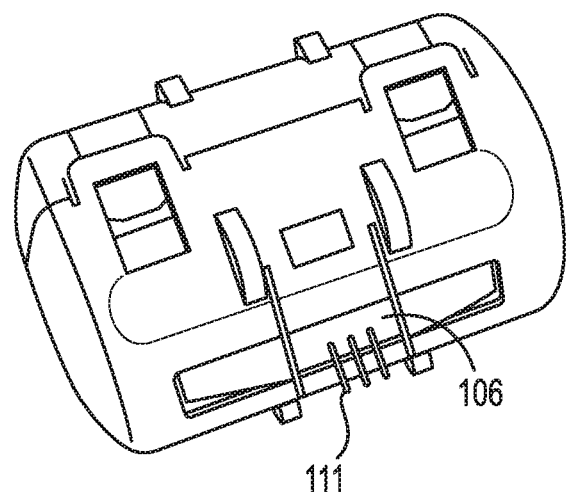
FIG. 8 is a perspective view of the current sensor of FIG. 1 showing the Hall effect sensor without wires attached according to certain embodiments.

The enclosure 104 and one of the ferromagnetic component halves 102 include apertures 105 and 107, respectively, for receiving the Hall-effect sensor 106 integrated circuit chip. FIG. 3 shows the aperture 105 in the core portion 102 and FIG. 7 shows the aperture 107 in the housing 104. FIG. 8 shows the Hall effect sensor disposed in the assembled device 100 with the pin leads 111 protruding outward from the housing 104.

The ferromagnetic core portion 102b hosting the Hall effect sensor 106 in this embodiment is shaped to have the minimum structurally-sustainable ferromagnetic width in order to direct the maximum magnetic flux to the Hall effect sensor 106. FIG. 3 shows that core portion 102b can be particularly shaped by defining channels inward from the longitudinal ends to act as a flux concentrator for the Hall effect sensor by defining channels 113 inward from the longitudinal ends.

Figure 9:
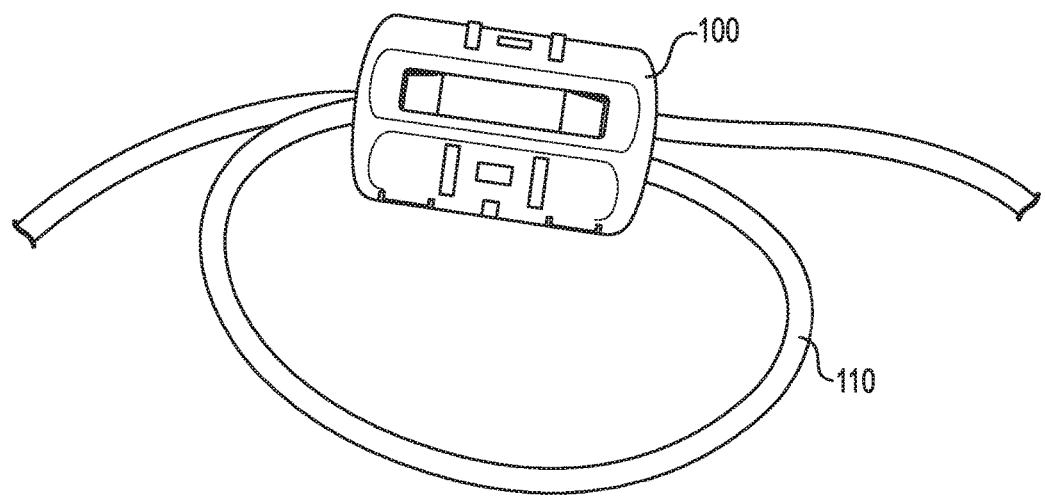
FIG. 9 is a photo of a current sensor clamped to a wire according to certain example embodiments in order to measure current in the wire.
Figure 10:
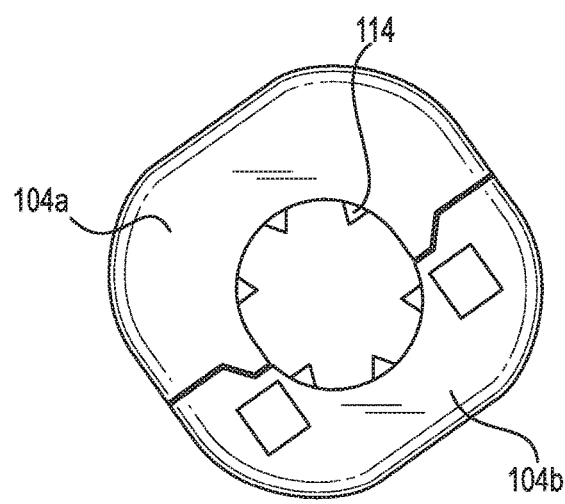
FIG. 10 is an end view of a current sensor according to certain embodiments.

Referring to FIG. 9, the wire 110 being measured can be looped one or multiple times and then the sensor 100 can be clamped over the overlapping section of the looped wire. Doing this increases the sensitivity of the current measurement. Increasing the number of loops will increase the accuracy of the small current measurement but lowers the peak-to-peak current range that the sensor 100 can measure.

The plastic enclosure 104 can be molded to form the desired shape. The ferromagnetic components 102 can also be formed by a molding operation. A suitable Hall effect sensor can be acquired from a variety of commercial sources.

A plurality of teeth 114 can be defined in the longitudinal ends of each enclosure portion 104a, 104b. The teeth 114 restrain the sensor from sliding along the length of the wire because the teeth bite into the insulation of the wire 110 being tested. Alternatively, the teeth can be defined on only one of the enclosure portions. The teeth can take any shape such that they protrude inward towards the wire 110.

Figure 11:
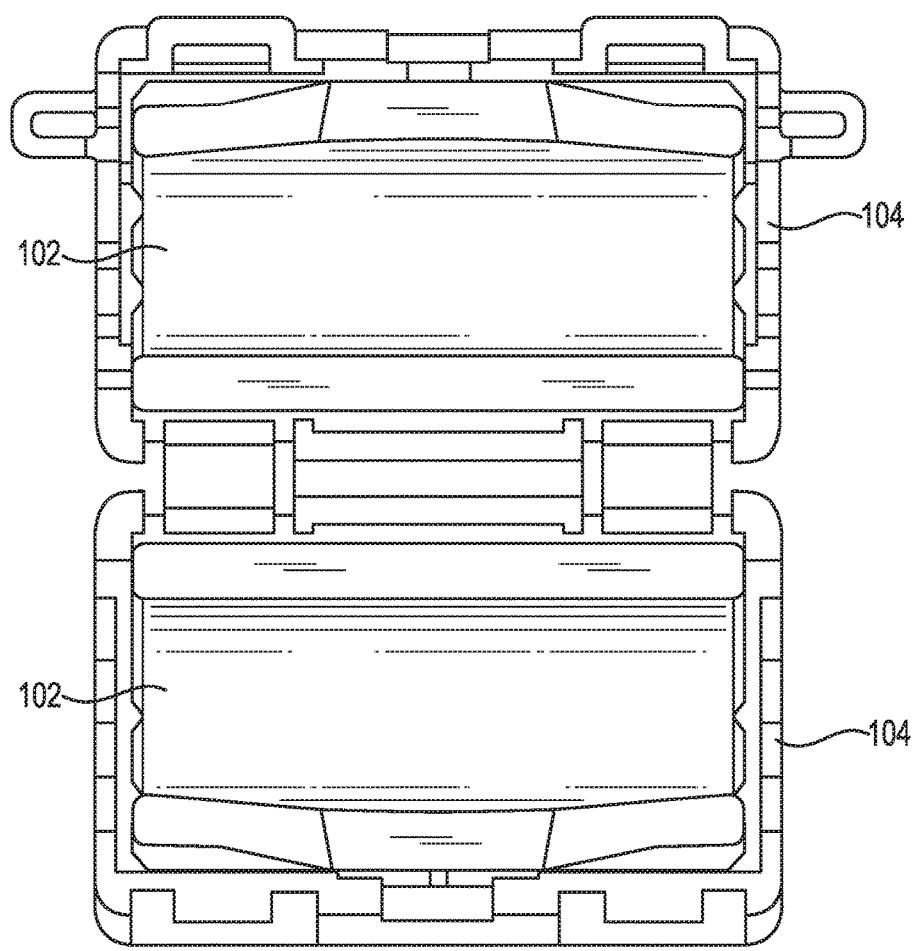
FIG. 11 is a perspective view of a current sensor according to another embodiment.
Figure 12:
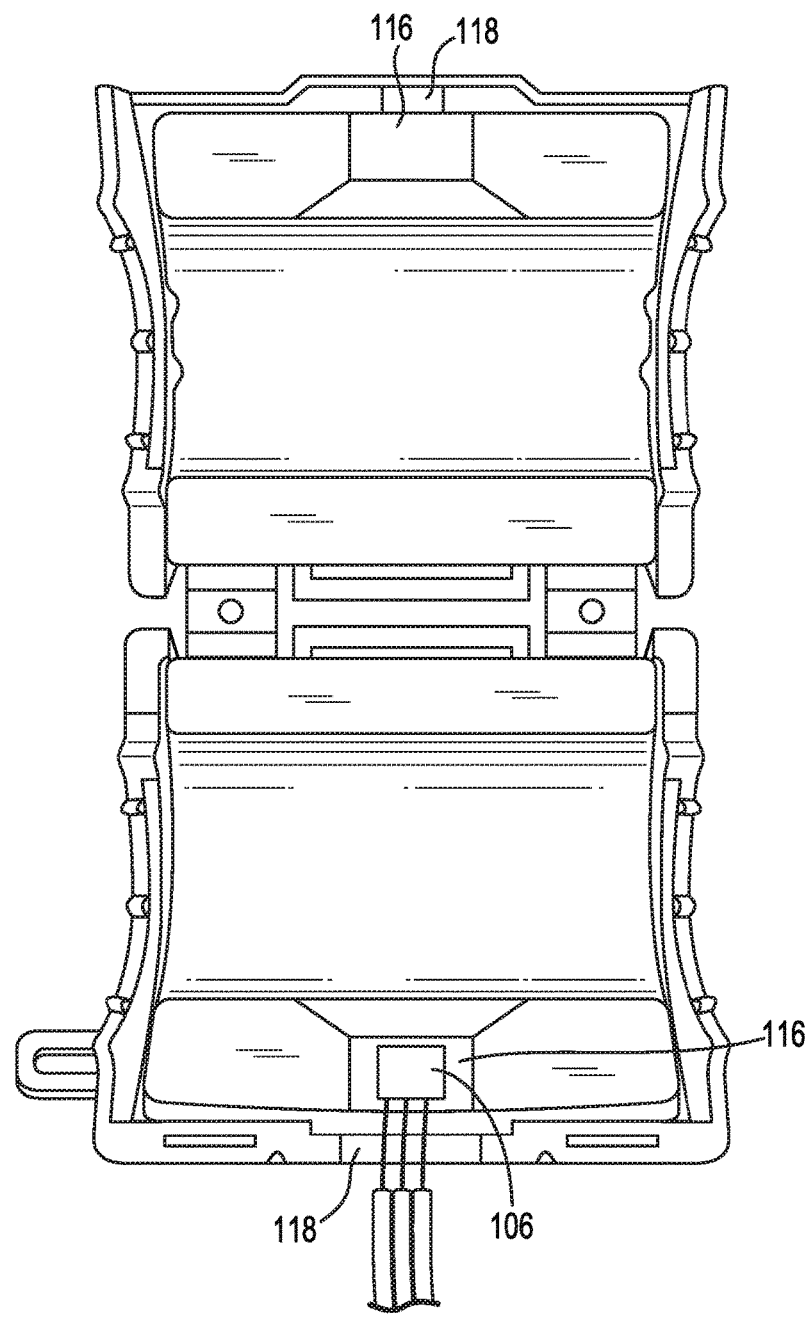
FIG. 12 is a perspective view of the current sensor of FIG. 11 showing the placement of the Hall effect sensor according to certain embodiments.

FIGS. 11-12 disclose a different embodiment where there is no longer an aperture 105 through the core portion or an aperture 107 through the housing. Instead, the opposing lengthwise edge surfaces 116 of the core portions 102 define a slight gap where the Hall effect sensor 106 is placed. When the halves of the enclosure 104 are closed together, the Hall effect sensor is held in place by the housing and/or the frictional fit between the core 102 halves. The Hall effect sensor also can be glued onto one-half of the edge surface 116 of one of the core 102 halves.

A small notch 118 can be defined in one or both of the enclosure 104 halves to provide clearance for the wires 112 to pass.

The core 102 portions of FIG. 11 can omit the notch 113 that was shown in FIG. 3. Although, one or both of the edge surfaces 116 can have material removed adjacent to where the hall effect sensor 106 will be located. This is shown in FIG. 12. This removal is done for the same reasons as the notches 113 defined in core portion 102b of the embodiment of FIG. 3.

Adding a segment of material to the gap between the core portions can be selectively performed to decrease magnetic field and sensitivity and increase the measurement current range depending on the particular magnetic properties of the material chosen for the segment. For example, a material with higher reluctance than air can be chosen to decrease the sensed magnetic field and increase the measurement current range.

The shape and width of the air gap between the respective core portions (where the Hall effect sensor is located) can be varied to decrease the magnetic field and sensitivity and increase the current range, or vice-versa. This is because increasing the size of the air gap will increase reluctance, and narrowing of the gap will decrease reluctance. Shape changes also can alter the reluctance property.

The Hall effect sensor can also be chosen with particular characteristics to increase or decrease current sensing sensitivity. For example, for the Honeywell SS495A family Hall effect sensor, the sensitivity is 3.125 mV/G while the SS496A family is 2.5 mV/G. The unit mV is millivolt (1/1000 volt) of electric voltage unit and G (gauss) is the magnetic field flux density. The current sensor can sense magnetic field based on the current flow through it. By using different Hall effect sensor sensitivity, the current sensor 100 can increase and decrease its measurement range.

A current monitor control board can also be provided to or embedded in the enclosure 104 where the enclosure needs to be enlarged to provide space for the control board and Hall effect sensor that will be mounted on the board. The current sensor can also be used as part of a battery monitoring system.

Figure 13:
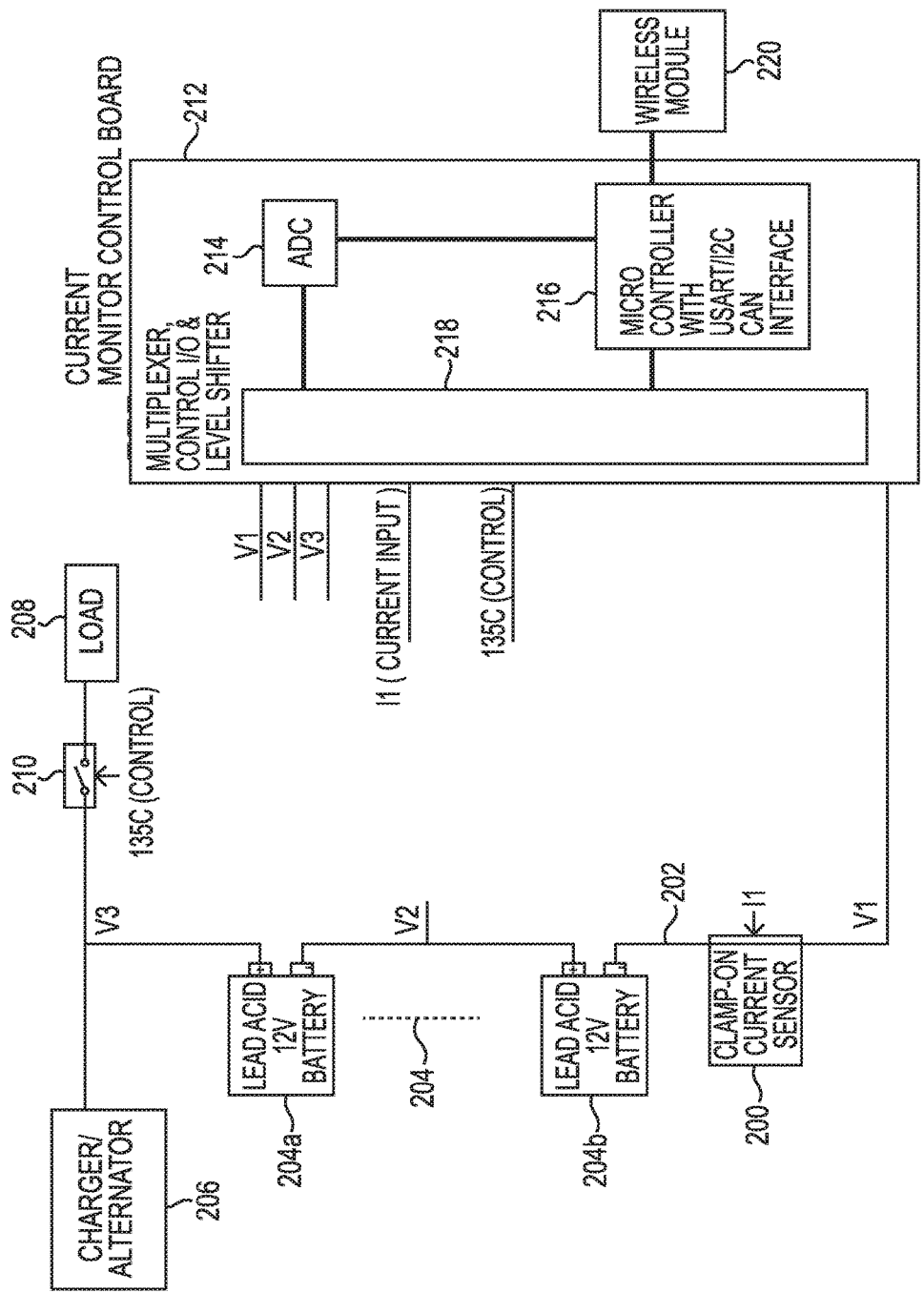
FIG. 13 is a diagram of a battery current monitoring system according to certain example embodiments.

Referring to FIG. 13, a current sensor according to the disclosure is shown as part of a battery current monitoring system. The physical current sensor 200 is clamped over a wire 202 leading from a battery system 204. The clamped position can be anywhere inside the battery module 204 current wire path. In FIG. 13, the battery system 204 includes a first battery cell 204a and a second battery cell 204b. The battery system can also be just a single battery cell, or it can include more than two battery cells.

The battery cells depicted in FIG. 13 are 12V lead-acid batteries. However, other voltages of lead acid batteries, battery chemistries and configurations can be provided without departing from the scope of the invention.

The battery system is also connected to a battery charger/alternator/generator 206 and a load 208. The load 208, which can be a motor with a control board or a starter motor with related circuitry inside a vehicle, can be selectively disconnected via switch 210. The charger/alternator/generator can also be an alternator of a vehicle, a battery charger or other power source for charging the battery systems.

The current monitor system also includes a current monitoring control board 212. The control board includes an analog to digital converter (ADC) 214 coupled to a microcontroller (processor) 216, which are both coupled to a multiplexer, control I/O and level shifter 218.

A wireless module 220 can also be coupled to the microcontroller 216 in order to report the sensor output wirelessly to another component, such as for example, a smart phone, a battery system controller, a data cloud, a remotely-located server computer, a computing device, etc. Two way communication can also be established via the wireless module 220 so that the control software for the controller 216 can be updated or altered. The wireless module can be a Wi-Fi module, Bluetooth module or other wireless communications interface.

The current sensor 200 and current monitor control board 212 shown in FIG. 13 can measure the battery system 204 charging and discharging voltages as well as the current to the battery system, battery temperature (not shown in figures) and alternator/charger inside the car or other battery powered vehicles. Thus, the health and status of battery and alternator/charger can be monitored.

The Hall sensor 106 can also be optionally mounted on the control board and no wires are needed. The current monitor control board 212 can be included in the current sensor's housing.

The current monitor control board 212 can include a CAN (Control Area Network) interface. This allows the sensor 200 and control board 212 to be connected to a vehicle's computer CAN bus network.

More than one current sensor can be deployed in a battery monitoring system.

One or more of the current sensors 200 can monitor the multiple battery system by measuring the current and voltage level for various battery cells, in order to determine the battery cells aging and health.

The current monitor system can be used as a battery capacity indicator for either single or multiple batteries. Since the OCV (open circuit voltage) of the battery cell and also the charging/discharging current and voltage increase or decrease relative to time is known, the battery capacity not only for one battery cell but also multiple battery cells can be calculated.

The current sensor can also be used for sensing AC (alternating current) measurement. The hall effect sensor is responsive to the current change or magnetic flux change. Thus, it can be used to measure the AC current as well. The current sensor output signal can be processed by the built-in ADC, which has a very fast conversion time for new generations of microcontrollers. Thus, the AC current can be measured as well as the AC ripple of charging voltages by microcontroller software.

AC ripples of charging voltage may be caused by an aging or defective capacitor or other devices inside the charger/alternator. This AC ripple may reduce life of the battery cells. By identifying the voltage ripple from the charging source, this current monitor control board also may monitor the charging voltage quality of the charger/alternator/generator and eventually help to extend the battery cell life.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products. Moreover, features or aspects of various example embodiments may be mixed and matched (even if such combination is not explicitly described herein) without departing from the scope of the invention.

What is claimed is:

1. A current sensor, comprising:
a housing configured as a two-part clamshell;
a core disposed within the housing, the core defining a longitudinal axis between opposing end surfaces, the core being divided into at least two segments, the core defining a gap between opposing lengthwise edge surfaces of adjacent segments of the core, the opposing lengthwise edge surfaces spanning longitudinally between the opposing end surfaces; and
a sensor that senses magnetic field,
wherein the core is formed of a magnetic material and defines a central channel through which a wire, whose current is to be measured, can be disposed without cutting or modifying the wire,
wherein the sensor is disposed in the gap formed between the opposing lengthwise edge surfaces of adjacent segments of the core, and
wherein each of the opposing lengthwise edge surfaces defines a flat portion oriented parallel to the longitudinal axis of the core and centered between the opposing longitudinal ends thereof, a first sloped portion disposed between a first of the opposing longitudinal ends of the core and the flat portion, and a second sloped portion disposed between a second of the opposing longitudinal ends of the core and the flat portion.

2. The current sensor of claim 1, wherein one of the at least two segments of the core is disposed in a first part of the two-part clamshell and a second of the at least two segments of the core is disposed in a second part of the two-part clamshell.

3. The current sensor of claim 1, wherein the two-part clamshell housing is hinged along a first side and a latch is provided to a second opposing side thereof.

4. The current sensor of claim 1, wherein the two-part clamshell defines an aperture on each of a first and a second longitudinal opposing ends, and wherein a plurality of teeth protrude inwardly into at least one of the apertures at the first and second longitudinal opposing ends.

5. The current sensor of claim 1, wherein one part of the two-part clamshell includes a sensor notch defined in a wall thereof.

6. The current sensor of claim 1, wherein at least one of the at least two core segments defines a notch inwardly from each longitudinal end thereof.

7. The current sensor of claim 1, wherein the core resembles a hollow cylindrical tube.

8. The current sensor of claim 1, wherein the core has a non-circular cross-sectional shape.

9. The current sensor of claim 1, wherein the sensor is a Hall effect sensor.

10. The current sensor of claim 1, wherein the housing is formed of a plastic insulator material.

11. The current sensor of claim 1, further comprising a current monitor control board that includes the sensor, wherein the current monitor control board further includes an analog to digital converter (ADC) and a microcontroller, and wherein the sensor is coupled to each of the ADC and microcontroller.

12. The current sensor of claim 11, further comprising at least one of a wireless module and a CAN (Control area Network) interface coupled to the microcontroller.

13. A method of non-invasively measuring electrical current in a wire, the method comprising:
clamping a magnetic core around the wire while leaving the wire intact;
concentrating a magnetic flux surrounding the wire;
directing the magnetic flux to a Hall effect sensor by:
shaping each of a pair of opposing lengthwise edge surfaces of the magnetic core to define a flat portion oriented parallel to a longitudinal axis of the magnetic core and centering the flat portion between opposing longitudinal ends of the core, and
further shaping each of the pair of opposing lengthwise edge surfaces of the magnetic core to define a first sloped portion disposed between a first of the opposing longitudinal ends of the magnetic core and the flat portion, and a second sloped portion disposed between a second of the opposing longitudinal ends of the magnetic core and the flat portion;
measuring the magnetic flux; and
outputting a voltage corresponding to the measured magnetic flux.

14. The method of claim 13, further comprising looping the wire prior to clamping so that the wire passes through the core multiple times.

15. The method of claim 13, further comprising:
coupling the output voltage to an ADC; and
coupling the ADC to a microcontroller.

16. The method of claim 15, further comprising coupling the microcontroller to a wireless communications interface.

17. The method of claim 13, further comprising:
segmenting the magnetic core into at least a first and second portion;
housing each of the first and second portions of the magnetic core in a respective first and second portion of an insulated enclosure.

18. A battery current monitoring system, comprising:
a battery module;
a charger coupled to the battery module;
a load coupled to the battery module;
a switch disposed between the load and the battery module;
a wire coupled to the battery module;

a current sensor clamped around the wire such that the wire extends through the core while leaving the wire intact, the current sensor comprising:
a housing configured as a two-part clamshell;
a core disposed within the housing, the core defining a longitudinal axis between opposing end surfaces, the core being divided into at least two segments, the core defining a gap between opposing lengthwise edge surfaces of adjacent segments of the core, the opposing lengthwise edge surfaces spanning longitudinally between the opposing end surfaces; and
a sensor that senses magnetic field,
wherein the core is formed of a magnetic material and defines a central channel through which the wire can be disposed without cutting or modifying the wire,
wherein the sensor is disposed in the gap formed between the opposing lengthwise edge surfaces of adjacent segments of the core, and
wherein each of the opposing lengthwise edge surfaces defines a flat portion oriented parallel to the longitudinal axis of the core and centered between the opposing longitudinal ends thereof, a first sloped portion disposed between a first of the opposing longitudinal ends of the core and the flat portion, and a second sloped portion disposed between a second of the opposing longitudinal ends of the core and the flat portion; and
a current monitor control board, comprising:
an ADC coupled to the sensor; and
a microcontroller coupled to the ADC.

* * * * *